(12) United States Patent
Huang et al.

(10) Patent No.: US 11,528,035 B2
(45) Date of Patent: Dec. 13, 2022

(54) BIT SELECTION FOR POLAR CODING INCREMENTAL-REDUNDANCY HARQ

(71) Applicant: MediaTek Inc., Hsinchu (TW)

(72) Inventors: Tun-Ping Huang, Hsinchu (TW); Mao-Ching Chiu, Hsinchu (TW); Wei-De Wu, Hsinchu (TW); Chia-Wei Tai, Hsinchu (TW); Tien-Yu Lin, Hsinchu (TW)

(73) Assignee: MediaTek Inc.

( * ) Notice: Subject to any disclaimer, the term of this patent is extended or adjusted under 35 U.S.C. 154(b) by 0 days.

(21) Appl. No.: 17/343,618

(22) Filed: Jun. 9, 2021

(65) Prior Publication Data

US 2022/0014211 A1 Jan. 13, 2022

Related U.S. Application Data

(60) Provisional application No. 63/058,581, filed on Jul. 30, 2020, provisional application No. 63/051,091, filed on Jul. 13, 2020.

(51) Int. Cl.
*H03M 13/09* (2006.01)
*H04L 1/00* (2006.01)
*H04L 1/18* (2006.01)
*H03M 13/13* (2006.01)

(52) U.S. Cl.
CPC ......... *H03M 13/095* (2013.01); *H03M 13/13* (2013.01); *H04L 1/0061* (2013.01); *H04L 1/1819* (2013.01)

(58) Field of Classification Search
CPC ... H03M 13/095; H03M 13/13; H04L 1/0061; H04L 1/1819
See application file for complete search history.

(56) References Cited

U.S. PATENT DOCUMENTS

| 2002/0015419 | A1* | 2/2002 | Kim | ...................... H04L 1/1819 |
| | | | | 370/468 |
| 2019/0028119 | A1* | 1/2019 | Yang | ................. H03M 13/6343 |
| 2019/0052418 | A1* | 2/2019 | Li | ........................... H04L 1/203 |
| 2020/0083983 | A1* | 3/2020 | Chen | ................... H03M 13/618 |
| 2020/0195376 | A1* | 6/2020 | Zhang | ................... H04L 1/1819 |
| 2021/0099213 | A1* | 4/2021 | Chen | ..................... H03M 13/13 |
| 2021/0203450 | A1* | 7/2021 | Xu | ........................ H04L 1/1819 |

\* cited by examiner

*Primary Examiner* — Thien Nguyen
(74) *Attorney, Agent, or Firm* — Han IP PLLC; Andy M. Han

(57) ABSTRACT

Examples pertaining to bit selection for polar coding incremental-redundancy hybrid automatic repeat request (IR-HARQ) are described. An apparatus (e.g., UE) generates a re-transmission polar code block (CB) in a polar incremental redundancy HARQ (IR-HARQ) procedure. The apparatus then transmits the re-transmission polar CB as a re-transmission of an initial transmission of an initial polar code carrying a plurality of information bits. In generating the re-transmission polar CB, the apparatus selects one or more re-transmission information bits from the plurality of information bits.

19 Claims, 15 Drawing Sheets

1400

GENERATE, BY A PROCESSOR OF AN APPARATUS, A RE-TRANSMISSION POLAR CODE BLOCK (CB) IN A POLAR INCREMENTAL REDUNDANCY HARQ (IR-HARQ) PROCEDURE BY SELECTING ONE OR MORE RE-TRANSMISSION INFORMATION BITS FROM THE PLURALITY OF INFORMATION BITS
1410

TRANSMIT, BY THE PROCESSOR, THE RE-TRANSMISSION POLAR CB AS A RE-TRANSMISSION OF AN INITIAL TRANSMISSION OF AN INITIAL POLAR CODE CARRYING A PLURALITY OF INFORMATION BITS
1420

| | # OF RETX INFORMATION BITS IS BASED ON: | SELECTION ON 1ST TX INFORMATION BITS FOR RETX IS BASED ON: | RETX ENCODER INPUT BIT MAPPING INVOLVES: |
|---|---|---|---|
| EXAMPLE DESIGN A | | SIZE-2N POLAR INPUT SEQUENCE | MAPPING THE SELECTED RETX INFORMATION BITS AND THE CORRESPONDING RETX CRC BITS TO THE RELIABLE ENCODER INPUT BIT POSITIONS OF THE UPPER SIZE-N POLAR SUB-CODE, ACCORDING TO THE SIZE-N POLAR INPUT SEQUENCE |
| EXAMPLE DESIGN B | SIZE-2N POLAR INPUT SEQUENCE | SIZE-N POLAR INPUT SEQUENCE | |
| EXAMPLE DESIGN C | LOOKUP TABLE OR $K$, $N$ AND/OR $E$ | SIZE-N POLAR INPUT SEQUENCE | |

1400 

GENERATE, BY A PROCESSOR OF AN APPARATUS, A RE-TRANSMISSION POLAR CODE BLOCK (CB) IN A POLAR INCREMENTAL REDUNDANCY HARQ (IR-HARQ) PROCEDURE BY SELECTING ONE OR MORE RE-TRANSMISSION INFORMATION BITS FROM THE PLURALITY OF INFORMATION BITS
1410

TRANSMIT, BY THE PROCESSOR, THE RE-TRANSMISSION POLAR CB AS A RE-TRANSMISSION OF AN INITIAL TRANSMISSION OF AN INITIAL POLAR CODE CARRYING A PLURALITY OF INFORMATION BITS
1420

RECEIVE, BY A PROCESSOR OF AN APPARATUS, AN INITIAL POLAR CODE BLOCK (CB) AND A RE-TRANSMISSION POLAR CB AS A RE-TRANSMISSION OF THE INITIAL POLAR CB IN POLAR INCREMENTAL REDUNDANCY HARQ (IR-HARQ), THE RE-TRANSMISSION POLAR CB BEING GENERATED BY SELECTING ONE OR MORE RE-TRANSMISSION INFORMATION BITS FROM A PLURALITY OF INFORMATION BITS CARRIED IN THE INITIAL POLAR CB
1510

DECODE, BY THE PROCESSOR, THE INITIAL POLAR CB AND THE RE-TRANSMISSION POLAR CB USING A SAME DECODER
1520

FIG. 15

BIT SELECTION FOR POLAR CODING INCREMENTAL-REDUNDANCY HARQ

CROSS REFERENCE TO RELATED PATENT APPLICATION(S)

The present disclosure is part of a non-provisional application claiming the priority benefit of U.S. Patent Application No. 63/051,091 and 63/058,581, filed on 13 Jul. 2020 and 30 Jul. 2020, respectively. Contents of aforementioned applications are incorporated by reference in their entirety.

TECHNICAL FIELD

The present disclosure is generally related to mobile communications and, more particularly, to bit selection for polar coding incremental-redundancy hybrid automatic repeat request (IR-HARQ) in mobile communications.

BACKGROUND

Unless otherwise indicated herein, approaches described in this section are not prior art to the claims listed below and are not admitted as prior art by inclusion in this section.

In mobile communications based on the $3^{rd}$ Generation Partnership Project (3GPP) standards, polar codes are used as error-correction codes on $5^{th}$ Generation (5G) New Radio (NR) control channels. With polar code encoding, when K information bits are transmitted in a block of N bits, a channel is polarized into reliable and un-reliable bit-channels such that the K information bits are transmitted on the most reliable K bit-channels while the remaining N-K channels are unreliable (and hence may be set to 0). It would be desirable to apply IR-HARQ for the re-transmission of polar coding to gain capacity by relatively noiseless channel(s) and to enhance likelihood in recovery of vulnerable information bits in re-transmission. Therefore, there is a need for a solution to perform bit selection for polar coding IR-HARQ in mobile communications.

SUMMARY

The following summary is illustrative only and is not intended to be limiting in any way. That is, the following summary is provided to introduce concepts, highlights, benefits and advantages of the novel and non-obvious techniques described herein. Select implementations are further described below in the detailed description. Thus, the following summary is not intended to identify essential features of the claimed subject matter, nor is it intended for use in determining the scope of the claimed subject matter.

One objective of the present disclosure is propose schemes, concepts, designs, systems, methods and apparatus pertaining to bit selection for polar coding IR-HARQ in mobile communications. It is believed that the various schemes proposed herein may allow IR-HARQ to be applied for the re-transmission of polar coding so as to achieve more polarization to gain capacity by relatively noiseless channels and to enhance likelihood in recovery of vulnerable information bits in re-transmission.

In one aspect, a method may involve generating a re-transmission polar code block (CB) in a polar IR-HARQ procedure. The method may also involve transmitting the re-transmission polar CB as a re-transmission of an initial transmission of an initial polar code carrying a plurality of information bits. In generating the re-transmission polar CB, the method may involve selecting one or more re-transmission information bits from the plurality of information bits.

In another aspect, a method may involve receiving an initial polar CB and a re-transmission polar CB as a re-transmission of the initial polar CB in polar IR-HARQ. The method may also involve decoding the initial polar CB and the re-transmission polar CB using a same decoder. The re-transmission polar CB may be generated by selecting one or more re-transmission information bits from a plurality of information bits carried in the initial polar CB.

In still another aspect, an apparatus may include a transceiver and a processor coupled to the transceiver. The transceiver may be configured to communicate wirelessly. The processor may be configured to perform operations involving: (a) generating a re-transmission polar CB in a polar IR-HARQ procedure; and (b) transmitting, via the transceiver, the re-transmission polar CB as a re-transmission of an initial transmission of an initial polar code carrying a plurality of information bits. The processor may select one or more re-transmission information bits from the plurality of information bits in generating the re-transmission polar CB.

It is noteworthy that, although description provided herein may be in the context of certain radio access technologies, networks and network topologies such as 5G/New Radio (NR) mobile networking, the proposed concepts, schemes and any variation(s)/derivative(s) thereof may be implemented in, for and by other types of wireless and wired communication technologies, networks and network topologies such as, for example and without limitation, Ethernet, Evolved Packet System (EPS), Universal Terrestrial Radio Access Network (UTRAN), Evolved UTRAN (E-UTRAN), Global System for Mobile communications (GSM), General Packet Radio Service (GPRS)/Enhanced Data rates for Global Evolution (EDGE) Radio Access Network (GERAN), Long-Term Evolution (LTE), LTE-Advanced, LTE-Advanced Pro, Internet-of-Things (IoT), Industrial IoT (IIoT), Narrow Band Internet of Things (NB-IoT), and any future-developed networking technologies. Thus, the scope of the present disclosure is not limited to the examples described herein.

BRIEF DESCRIPTION OF THE DRAWINGS

The accompanying drawings are included to provide a further understanding of the disclosure and are incorporated in and constitute a part of the present disclosure. The drawings illustrate implementations of the disclosure and, together with the description, serve to explain the principles of the disclosure. It is appreciable that the drawings are not necessarily in scale as some components may be shown to be out of proportion than the size in actual implementation in order to clearly illustrate the concept of the present disclosure.

FIG. 6 is a diagram of an example design summary under a proposed scheme in accordance with the present disclosure.

Figure 7:
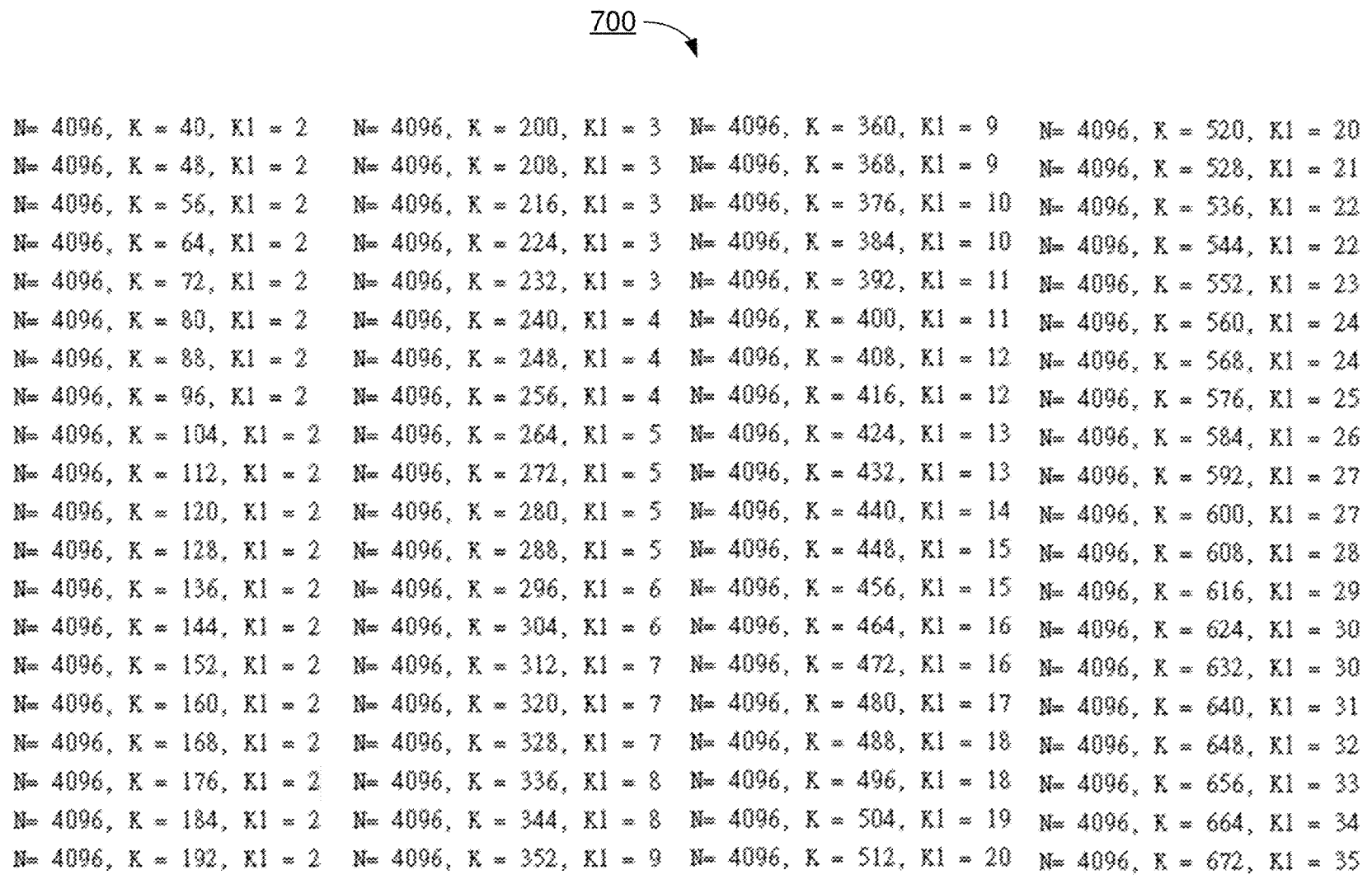

FIG. 7 is a diagram of an example design under a proposed scheme in accordance with the present disclosure.

Figure 8:
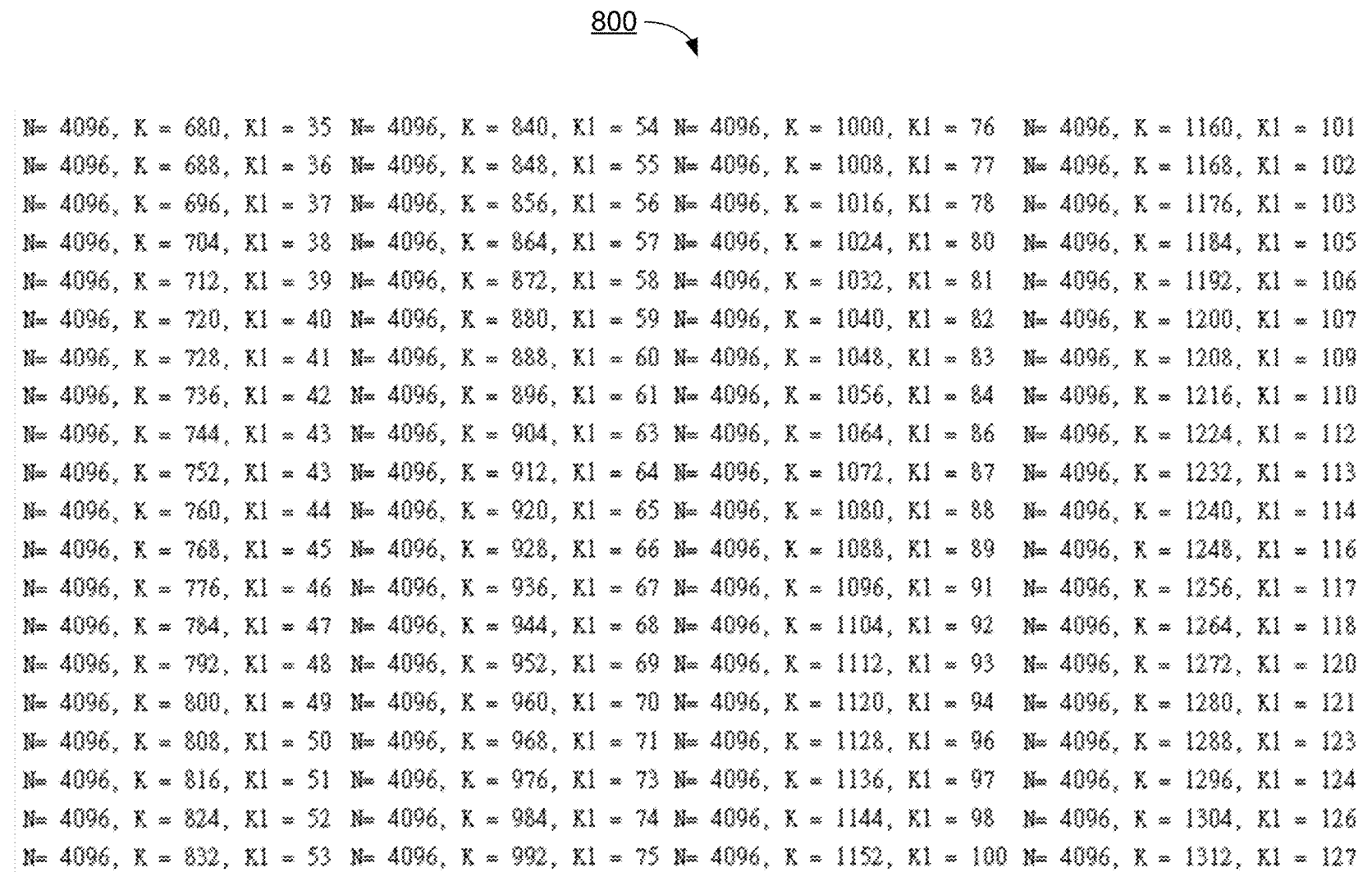

FIG. 8 is a diagram of an example design under a proposed scheme in accordance with the present disclosure.

Figure 9:
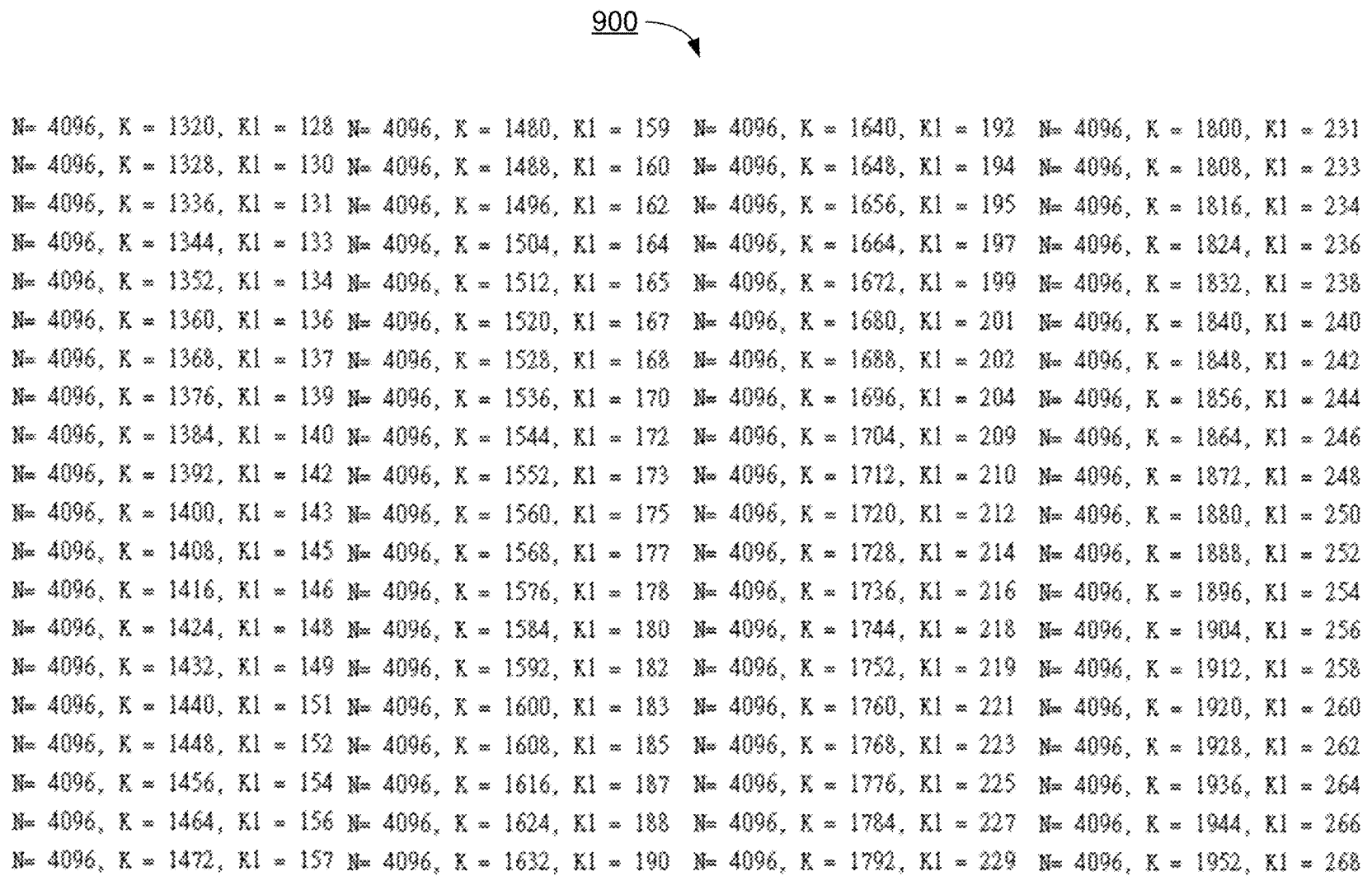

FIG. 9 is a diagram of an example design under a proposed scheme in accordance with the present disclosure.

Figure 10:
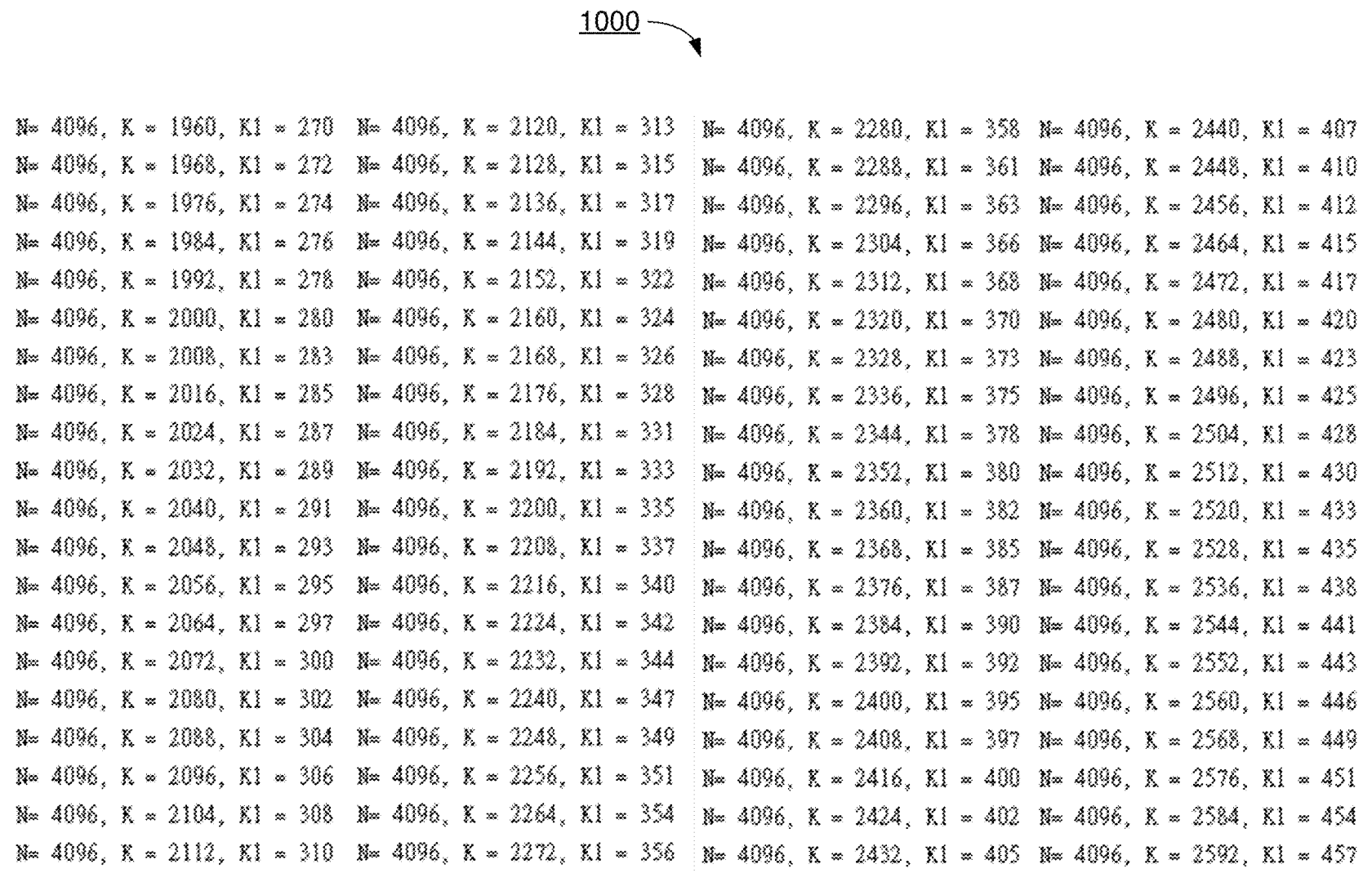

FIG. 10 is a diagram of an example design under a proposed scheme in accordance with the present disclosure.

Figure 11:
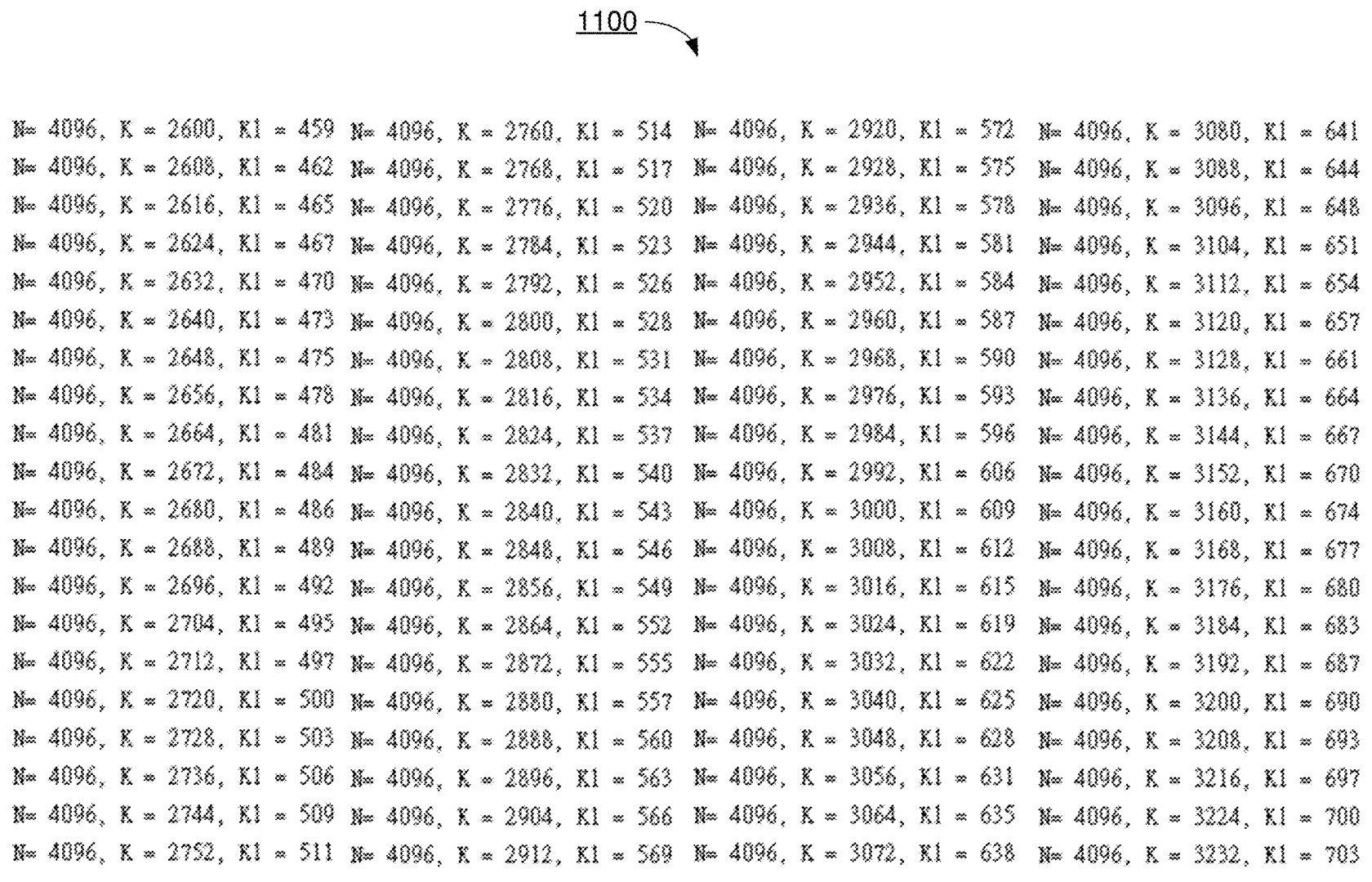

FIG. 11 is a diagram of an example design under a proposed scheme in accordance with the present disclosure.

Figure 12:
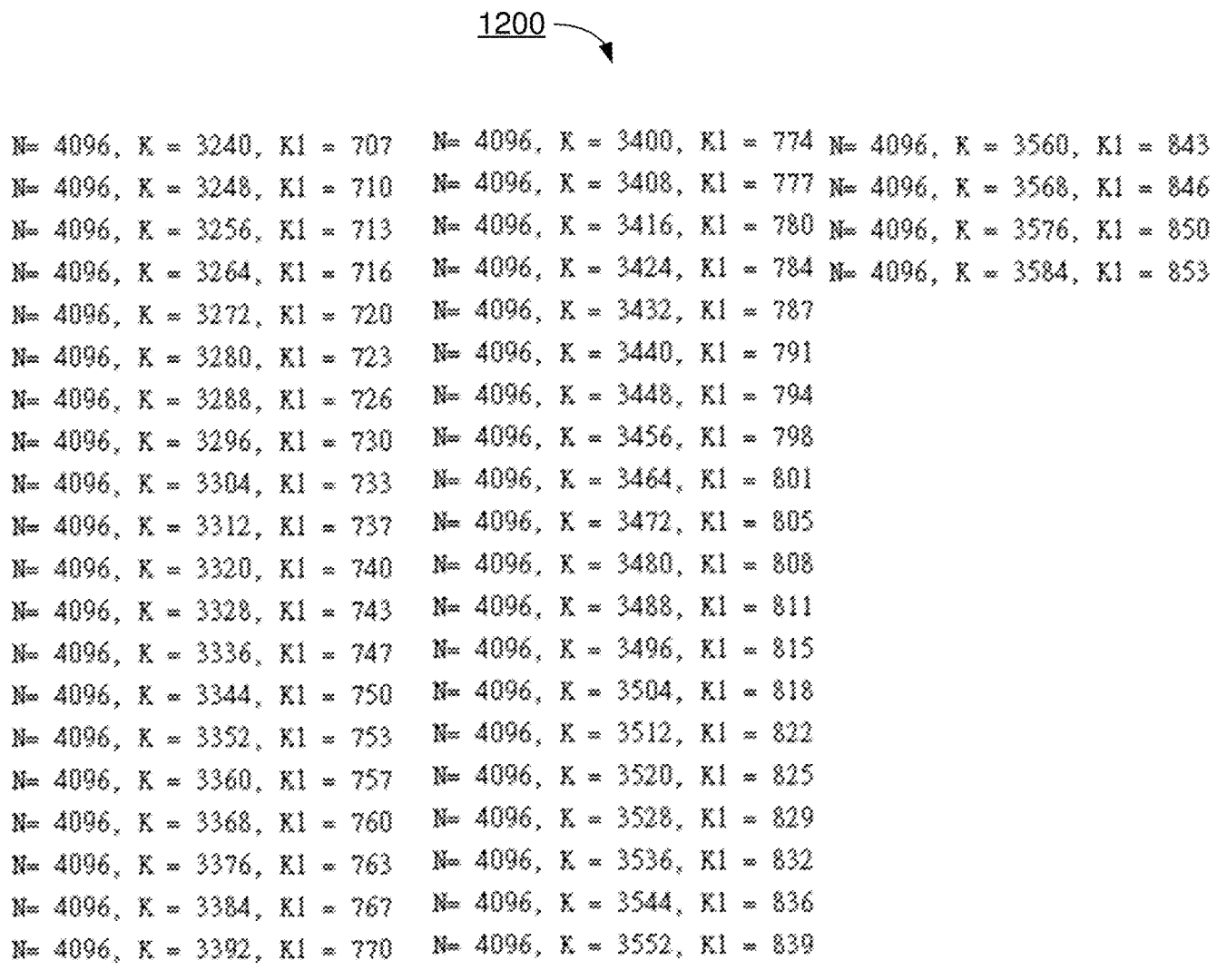

FIG. 12 is a diagram of an example design under a proposed scheme in accordance with the present disclosure.

FIG. 14 is a flowchart of an example process in accordance with an implementation of the present disclosure.

FIG. 15 is a flowchart of an example process in accordance with an implementation of the present disclosure.

DETAILED DESCRIPTION OF PREFERRED IMPLEMENTATIONS

Detailed embodiments and implementations of the claimed subject matters are disclosed herein. However, it shall be understood that the disclosed embodiments and implementations are merely illustrative of the claimed subject matters which may be embodied in various forms. The present disclosure may, however, be embodied in many different forms and should not be construed as limited to the exemplary embodiments and implementations set forth herein. Rather, these exemplary embodiments and implementations are provided so that description of the present disclosure is thorough and complete and will fully convey the scope of the present disclosure to those skilled in the art. In the description below, details of well-known features and techniques may be omitted to avoid unnecessarily obscuring the presented embodiments and implementations.

Overview

Implementations in accordance with the present disclosure relate to various techniques, methods, schemes and/or solutions pertaining to bit selection for polar coding IR-HARQ in mobile communications. According to the present disclosure, a number of possible solutions may be implemented separately or jointly. That is, although these possible solutions may be described below separately, two or more of these possible solutions may be implemented in one combination or another.

Figure 1:
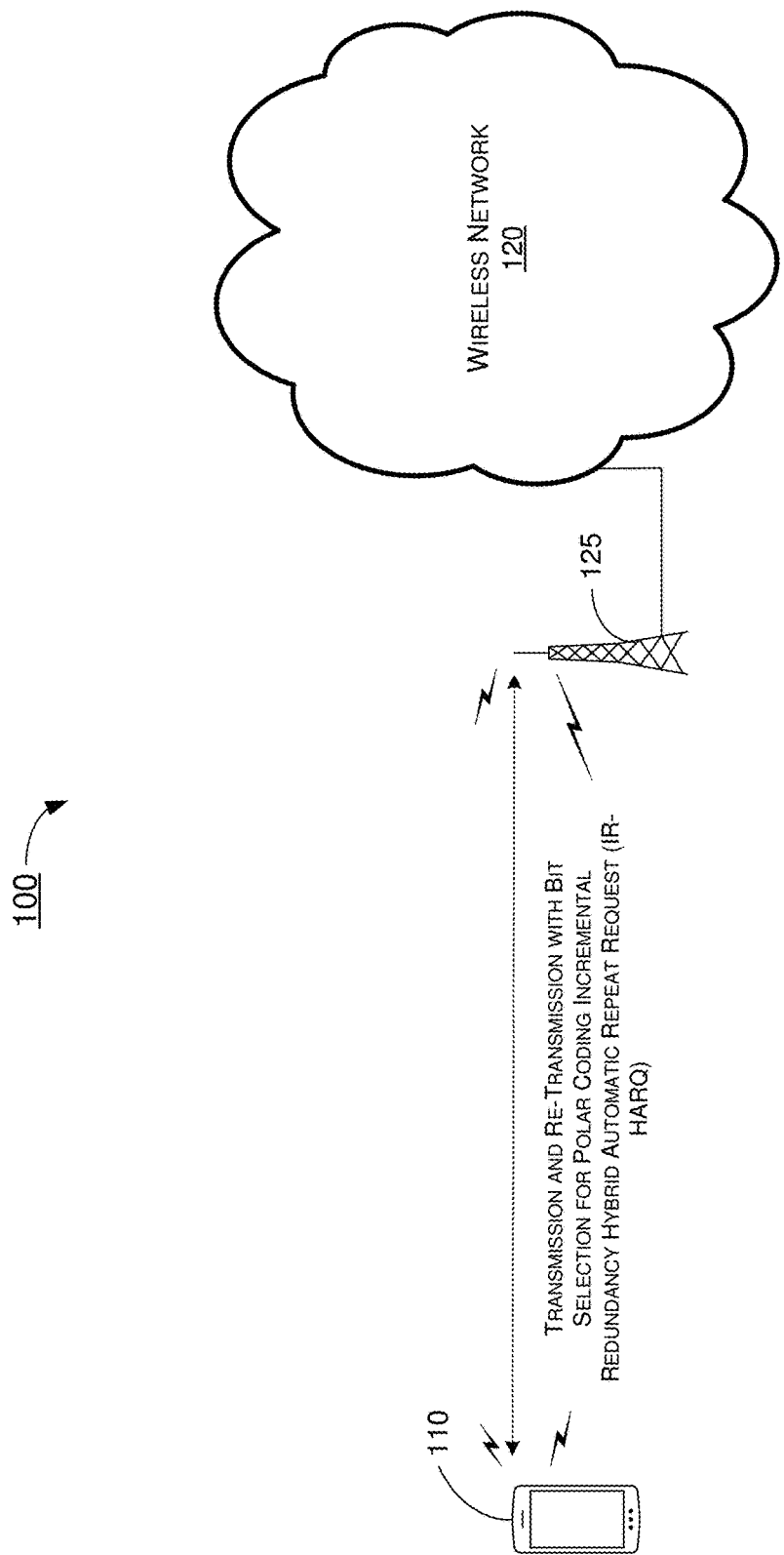
FIG. 1 is a diagram of an example network environment in which various solutions and schemes in accordance with the present disclosure may be implemented.

FIG. 1 illustrates an example network environment 100 in which various solutions and schemes in accordance with the present disclosure may be implemented. Referring to FIG. 1, network environment 100 may involve a user equipment (UE) 110 and a wireless network 120. UE 110 and network 120 may be in wireless communications via one or more network nodes (e.g., eNBs, gNBs and/or transmit/receive points (TRPs)) including a network node 125. In network environment 100, UE 110 and wireless network 120 may be configured to implement various schemes pertaining to bit selection for polar coding IR-HARQ in mobile communications in accordance with the present disclosure, as described herein.

In general, with polar codes, channel capacity gain may be achieved by polarization of channels with a Kronecker (recursive) characteristic for $N=2^n$. That is, as a result of the polarization effect, one part of the channels may become noisy or relatively noisy while another part of the channels may become noiseless or relatively noiseless. Accordingly, in encoding information bits for transmission, an encoder in UE 110 or network node 125 may freeze the noisy channels by setting bits transmitted on those noisy channels to zero while exploiting the noiseless channels for transmission of information bits. The noiseless channels may achieve channel capacity in case $N \to \infty$. Under various proposed schemes in accordance with the present disclosure, incremental redundancy structure may be applied for the re-transmission of polar coding. It is believed that, under the various proposed schemes, more polarization may result in capacity gain by relatively noiseless channels. Moreover, under the various proposed schemes, recovery of vulnerable information bits may become more likely in re-transmission.

Under a proposed scheme in accordance with the present disclosure, an initial transmission and its associated re-transmission(s) may be generated from a joint polar code with a larger size of N'. For instance, N'=2N when N is the polar code size for the initial transmission. Under the proposed scheme, a part of a plurality of information bits carried in the initial transmission in a re-transmission. For instance, one or more re-transmission information bits may be selected from the plurality of information bits based on a second polar input sequence or a lookup table. It is believed that the re-transmission CRC may allow UE 110 or network node 125 to reduce complexity in decoding a size-N' joint polar code.

Figure 2:
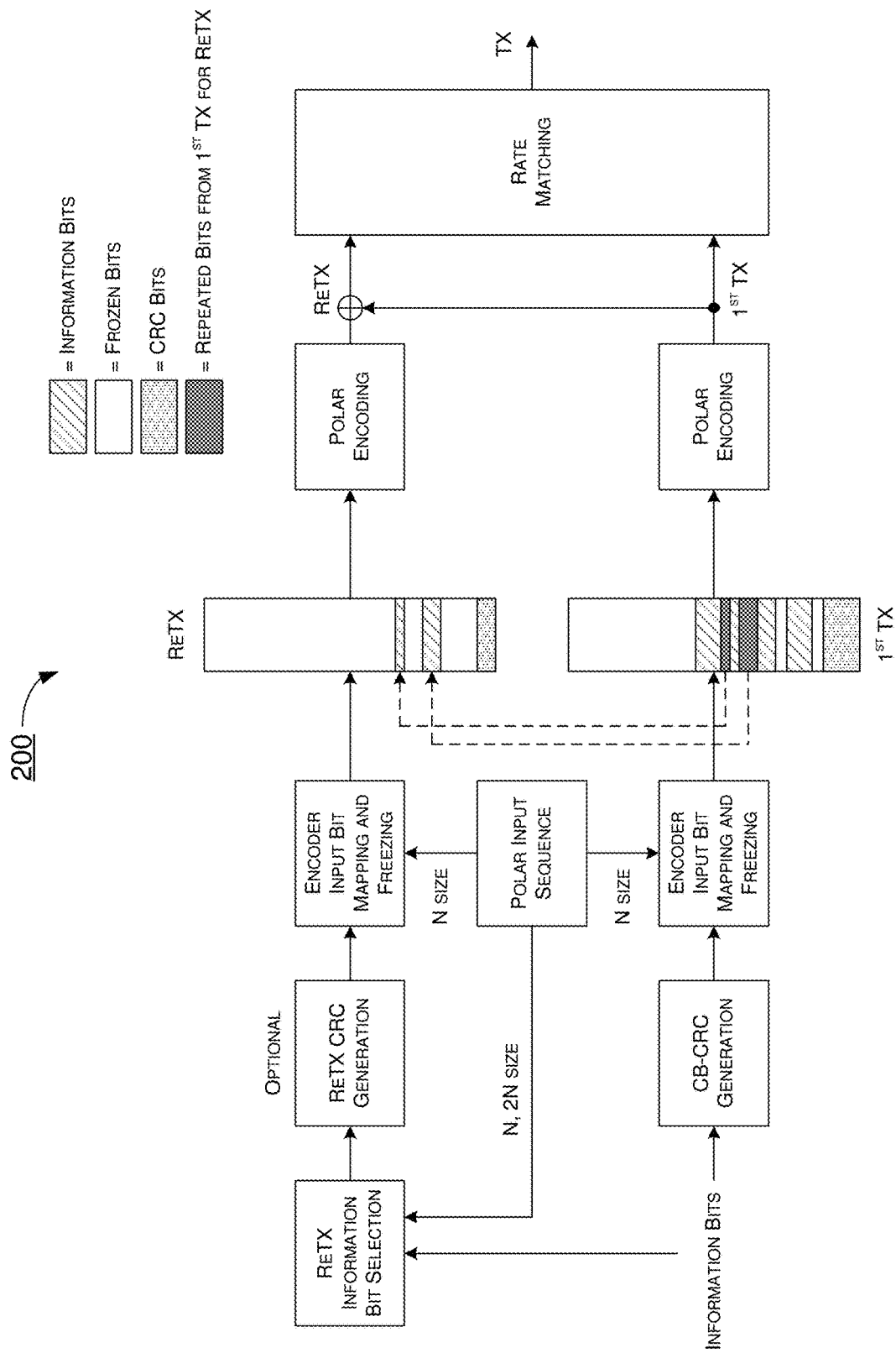
FIG. 2 is a diagram of an example design in an implementation under a proposed scheme in accordance with the present disclosure.

FIG. 2 illustrates an example design 200 in an implementation under a proposed scheme in accordance with the present disclosure. In design 200, for an initial transmission (denoted as "1$^{st}$ TX" in FIG. 2), a code block cyclic redundancy check (CB CRC) may be generated with a plurality of information bits to be transmitted as input. For instance, the CB CRC may be generated as an NR physical downlink shared channel (PDSCH) CB CRC. Then, encoder input bit mapping and freezing may be performed based on the CB CRC and a polar input sequence of a size N to generate a size-N polar sub-code carrying the information bits, which is shown in the lower portion of FIG. 2. The encoder input bit mapping and freezing functional block may receive an input from the polar input sequence functional block that indicates the size of a polar CB to be generated as N bits (e.g., for the lower polar sub-code). The size-N polar sub-code carrying the information bits may then be processed by polar encoding to generate a size-N initial polar code to be rate-matched and transmitted.

In design 200, for re-transmission, one or more unreliable bits for the initial transmission may be selected from the plurality of information bits as one or more re-transmission information bits. For instance, selection of the one or more re-transmission information bits may be based on a second polar input sequence or a lookup table as a function of K, N and/or E. The re-transmission (ReTX) information bit selection functional block may also receive an input from the polar input sequence functional block that indicates the size of a polar CB to be generated as either N bits (e.g., for the initial transmission) or 2N bits (e.g., for the re-transmission). As an option, the one or more re-transmission information bits may be utilized in generating a re-transmission CRC (ReTX CRC). Then, encoder input bit mapping and freezing may be performed based on the one or more re-transmission information bits (or the ReTX CRC if available) and the same polar input sequence (used for the initial transmission) to generate a size-N polar sub-code carrying the one or more re-transmission information bits for IR-HARQ, which is shown in the lower portion of FIG. 2. The encoder input bit mapping and freezing functional block may receive an input from the polar input sequence functional block that indicates the size of a polar CB to be generated as N bits (e.g., for the upper polar sub-code). The size-N polar sub-code carrying the one or more re-transmission information bits may then be processed by polar encoding to generate a size-2N re-transmission polar code to be rate-matched and transmitted. In design 200, the output of the lower polar encoding functional block and the output of the upper polar encoding functional block may be XOR'd so that one size-N polar CB is provided as input to the rate-matching function block. For reduction in overhead and decoding complexity, the re-transmission may include ReTX CRC, which has a size smaller than (e.g., fewer bits) than that of the CB CRC.

Under a proposed scheme in accordance with the present disclosure, ReTX information bit selection may be based on a second sequence or a lookup table as a function of K, N and/or E. Moreover, under the proposed scheme, ReTX encoder input bit mapping may include additional ReTX CRC (optional) and may be based on the same polar input sequence as that used for the initial transmission (1$^{st}$ TX). Under the proposed scheme, one of several designs may be utilized in carrying out the ReTX information bit selection, as described below.

It is noteworthy that, in the following description of the different designs with respect to ReTX information bit selection, certain assumptions are made. For example, it is assumed that the following polar input sequence, listed in an order of ascending reliability, for N=16 is utilized: {0 1 2 4 8 3 5 9 6 10 12 7 11 13 14 15}. Moreover, it is assumed that the following polar input sequence, listed in an order of ascending reliability, for N=32 is utilized: {0 1 2 4 8 16 3 5 9 6 17 10 18 12 20 24 7 11 19 13 14 21 26 25 22 28 15 23 27 29 30 31}. Additionally, it is assumed that the number of encoder input bits is 9 bits and the size of ReTX CRC is 3 bits, and they occupy reliable encoder input bit positions.

Under a first design (or Design A) with respect to ReTX information bit selection, certain operations may be performed, namely: determination of the number of ReTX information bits (herein denoted as K1), selection of ReTX information bits, and ReTX encoder input bit mapping. With respect to determination of the number of ReTX information bits, based on a size-N polar input sequence, A1 may denote the set of the K most reliable input bit indices (excluding the input bit indices corresponding to shortened and punctured coded bits). Additionally, based on a size-2N polar input sequence, A2 may denote the set of the K most reliable input bit indices (excluding the input bit indices corresponding to shortened and punctured coded bits) where the index value is greater than or equal to N and modulo N. Then, the number of ReTX information bits may be determined as follows: K1=the number of bit indices that is in A1 but not in A2, and K1 may be 0. With respect to selection of ReTX information bits, information bits may be selected from the initial transmission carried by bit indices (or index) which is/are in A1 but not in A2 as the ReTX information bit(s). With respect to ReTX encoder input bit mapping, in case ReTX CRC generation is present, it may be assumed that the ReTX CRC has a size C (as a function of K1 and N) and may be generated from the K1 ReTX information bit(s). Based on a size-N polar input sequence, the K1 information bit(s) and C ReTX CRC bits may be mapped to (K1+C) most reliable input bit indices (excluding the input bit indices corresponding to shortened and punctured coded bits). It is noteworthy that, in case of K1=0, all input bits of ReTX encoder may be zero frozen bits.

Figure 3:
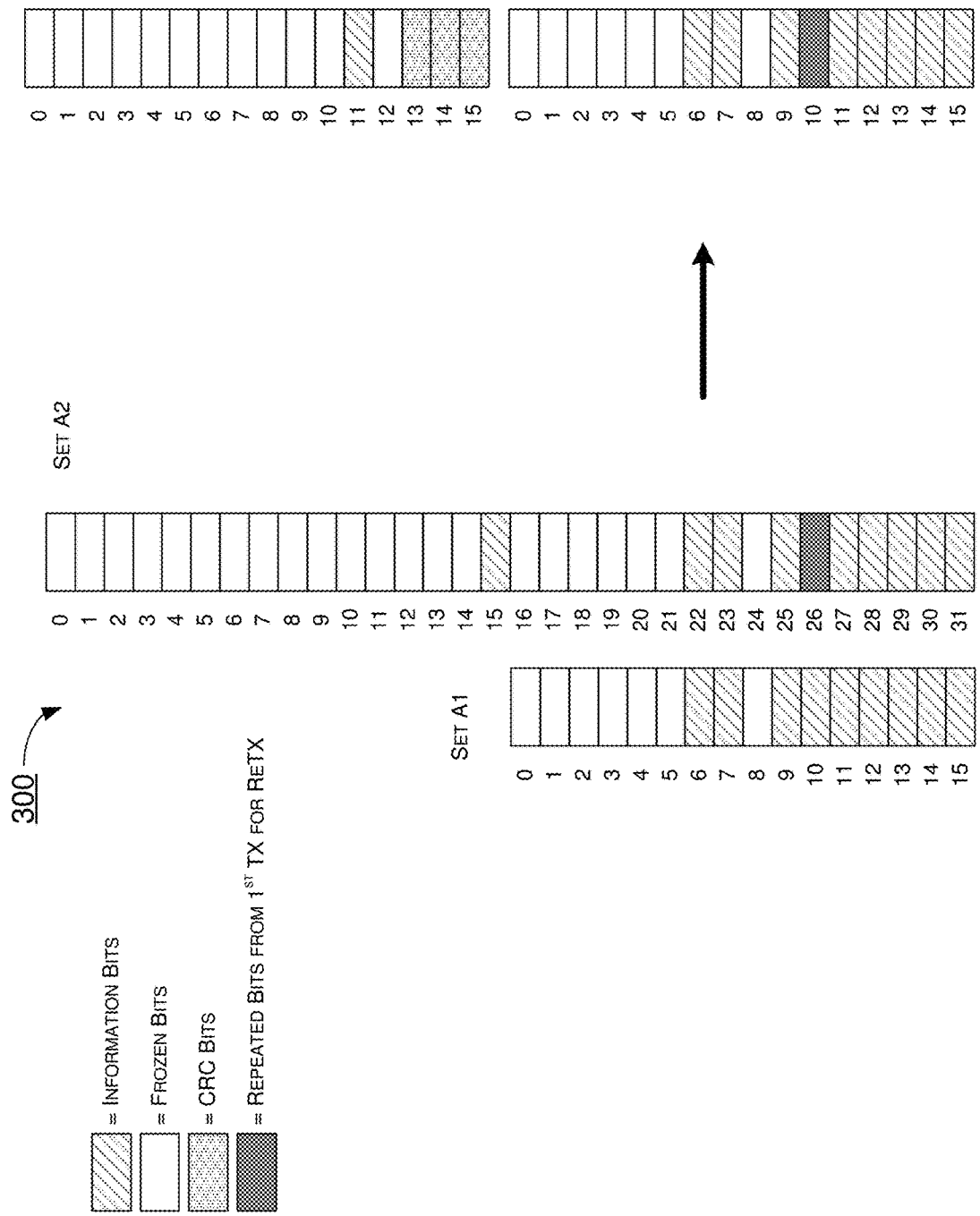
FIG. 3 is a diagram of an example scenario under a proposed scheme in accordance with the present disclosure.

FIG. 3 illustrates an example scenario 300 under the first design (Design A) of the proposed scheme in accordance with the present disclosure. Referring to the left side of FIG. 3, a Set A1 of indices corresponding to the 9 selected input bit positions for the 1$^{st}$ TX with size-N polar code may be provided or otherwise determined, and a Set A2 of {indices of the selected input bit positions with size-2N polar code and index value>=N} mode N may also be provided or otherwise determined. Then, 1$^{st}$ TX information bits with indices in Set A1 but not in Set A2 may be selected as one or more ReTX information bits. Referring to the right side of FIG. 3, with respect to ReTX encoder input bit mapping, the selected one or more ReTX information bits and the corresponding ReTX CRC bits may be mapped to the reliable encoder input bit positions of the upper size-N polar sub-code, according to the size-N polar input sequence.

Under a second design (or Design B) with respect to ReTX information bit selection, certain operations may be performed, namely: determination of the number of ReTX information bits (or K1), selection of ReTX information bits, and ReTX encoder input bit mapping. With respect to determination of the number of ReTX information bits, based on a size-2N polar input sequence, S may denote the set of the K most reliable input bit indices (excluding the input bit indices corresponding to shortened and punctured coded bits). Then, the number of ReTX information bits may be determined as follows: K1=the number of bit indices in S with index value<N, and K1 may be 0. With respect to selection of ReTX information bits, based on a size-N polar input sequence, K1 information bits occupying the least reliable input bit indices of the initial transmission (excluding the input bit indices corresponding to the shortened and punctured coded bits) may be selected as the ReTX information bit(s). With respect to ReTX encoder input bit mapping, in case ReTX CRC generation is present, it may be assumed that the ReTX CRC has a size C (as a function of K1 and N) and may be generated from the K1 ReTX information bit(s). Based on a size-N polar input sequence, the K1 information bit(s) and C ReTX CRC bits may be mapped to (K1+C) most reliable input bit indices (excluding the input bit indices corresponding to shortened and punctured coded bits). It is noteworthy that, in case of K1=0, all input bits of ReTX encoder may be zero frozen bits.

Figure 4:
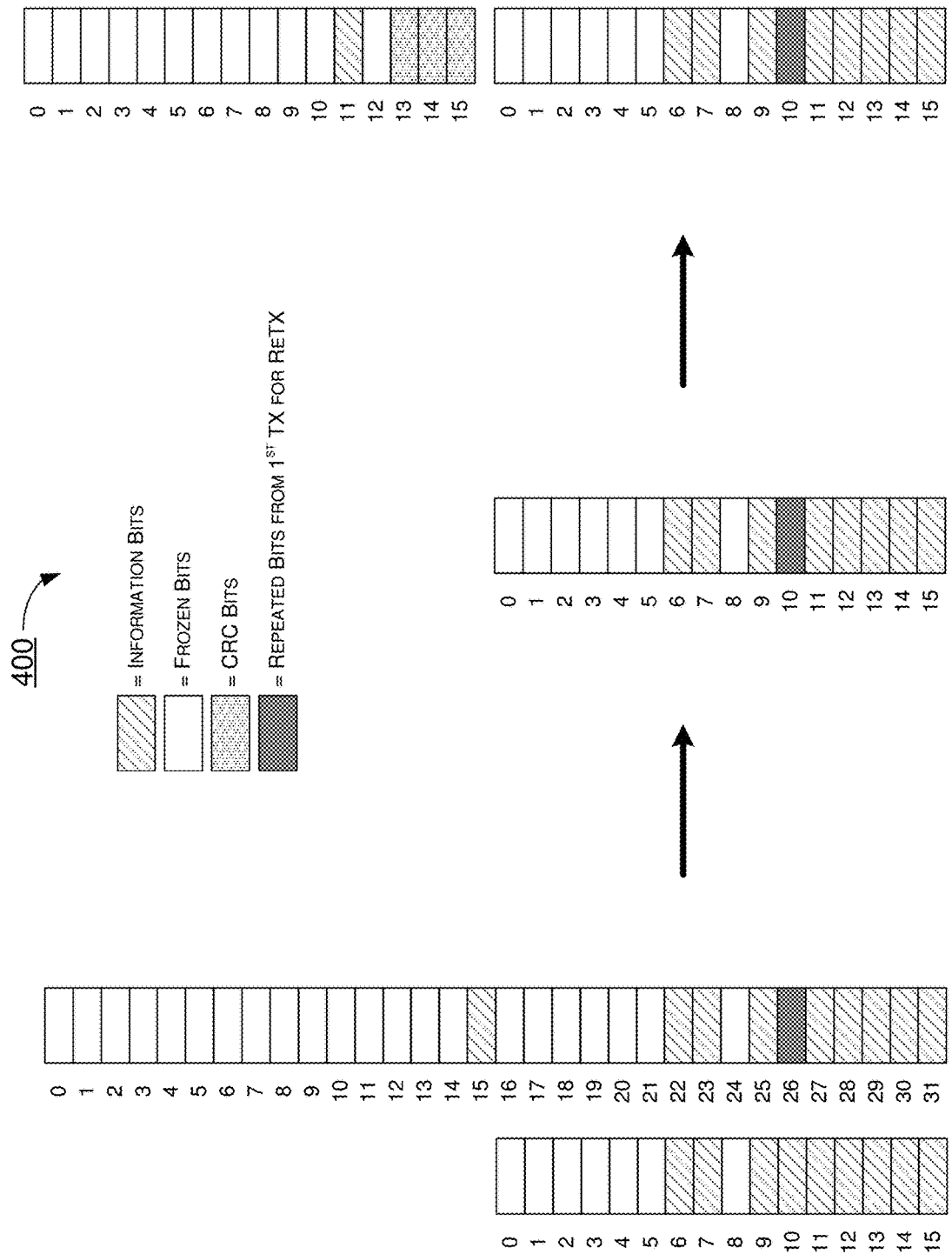
FIG. 4 is a diagram of an example scenario under a proposed scheme in accordance with the present disclosure.

FIG. 4 illustrates an example scenario 400 under the second design (Design B) of the proposed scheme in accordance with the present disclosure. Referring to the left side of FIG. 4, the number of ReTX information bits may be determined to be as follows: #ReTX information bits=#{indices of the selected input bit positions with size-2N polar code and index value<N}. Referring to the center portion of FIG. 4, with respect to ReTX information bit selection, the determined number of ReTX information bits may be selected from the information bits carried in the 1$^{st}$ TX with the least reliable bit positions, according to size-N polar input bit sequence. Referring to the right side of FIG. 4, with respect to ReTX encoder input bit mapping, the selected ReTX information bit(s) and the corresponding ReTX CRC bits may be mapped to the reliable encoder input bit positions of the upper size-N polar sub-code, according to the size-N polar input sequence.

Under a third design (or Design C) with respect to ReTX information bit selection, certain operations may be performed, namely: determination of the number of ReTX information bits (or K1), selection of ReTX information bits, and ReTX encoder input bit mapping. With respect to determination of the number of ReTX information bits, K1 may be obtained based on a lookup table (portions of which are shown in FIG. 7-FIG. 12) regarding K, N and/or E. With respect to selection of ReTX information bits, based on a size-N polar input sequence, K1 information bits occupying the least reliable input bit indices of the initial transmission (excluding the input bit indices corresponding to the shortened and punctured coded bits) may be selected as the ReTX information bit(s). With respect to ReTX encoder input bit mapping, in case ReTX CRC generation is present, it may be assumed that the ReTX CRC has a size C (as a function of K1 and N) and may be generated from the K1 ReTX information bit(s). Based on a size-N polar input sequence, the K1 information bit(s) and C ReTX CRC bits may be mapped to (K1+C) most reliable input bit indices (excluding the input bit indices corresponding to shortened and punctured coded bits). It is noteworthy that, in case of K1=0, all input bits of ReTX encoder may be zero frozen bits.

Figure 5:
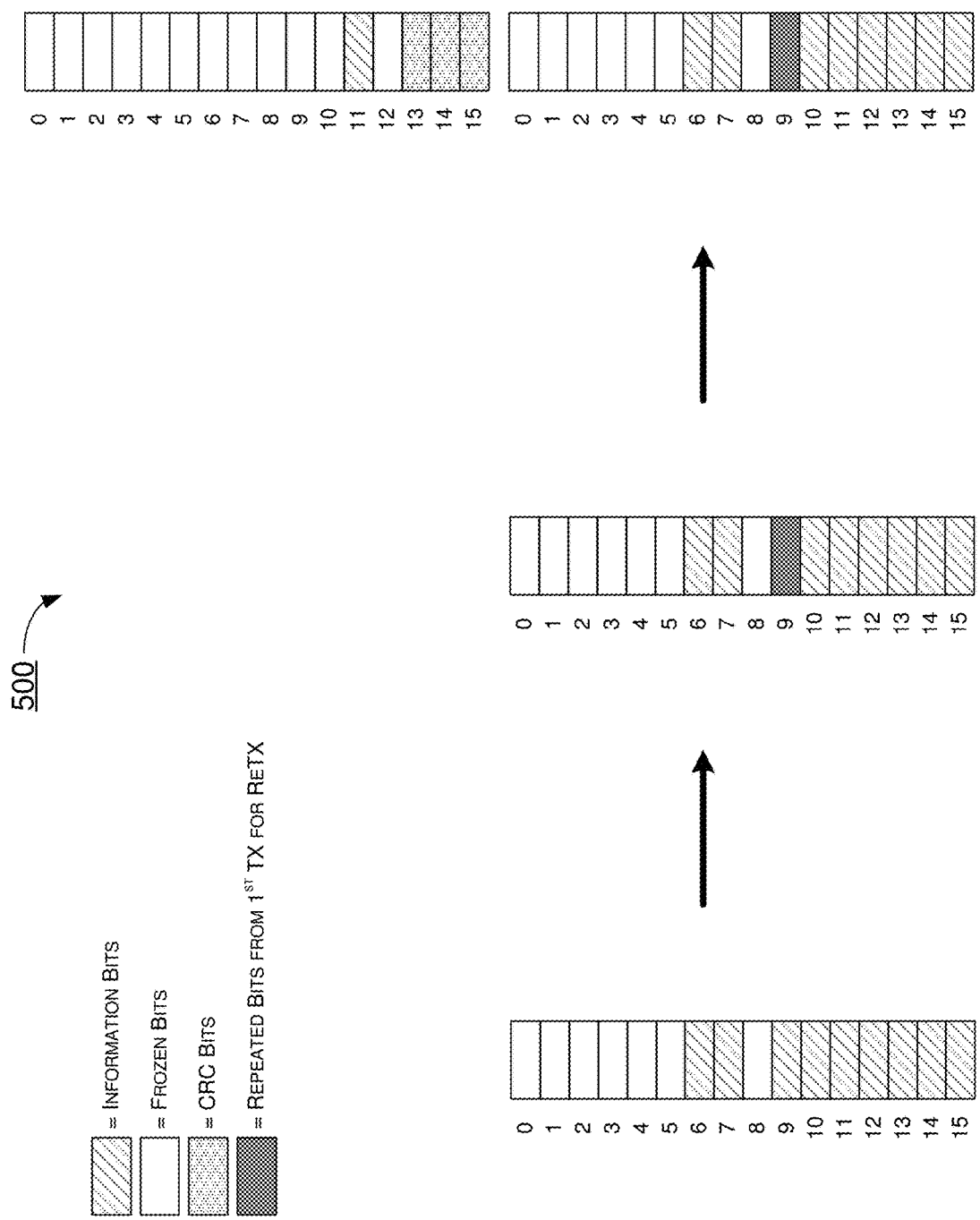
FIG. 5 is a diagram of an example scenario under a proposed scheme in accordance with the present disclosure.

FIG. 5 illustrates an example scenario 500 under the third design (Design C) of the proposed scheme in accordance with the present disclosure. Referring to the left side of FIG. 5, the number of ReTX information bits may be determined based on a lookup table or as a function of K, N and/or E. Referring to the center portion of FIG. 5, with respect to ReTX information bit selection, the determined number of ReTX information bits may be selected from the information bits carried in the 1$^{st}$ TX with the least reliable bit positions, according to size-N polar input bit sequence. Referring to the right side of FIG. 5, with respect to ReTX encoder input bit mapping, the selected ReTX information bit(s) and the corresponding ReTX CRC bits may be mapped to the reliable encoder input bit positions of the upper size-N polar sub-code, according to the size-N polar input sequence.

FIG. 6 illustrates an example design under a proposed design summary 600 in accordance with the present disclosure. In view of the above description, selection of one or more bits from the information bits carried in the 1$^{st}$ TX may be performed under one of three designs, namely Design A, Design B and Design C, which are summarized in design summary 600.

Under Design A, the number of ReTX information bits and the selection of one or more information bits carried in the 1$^{st}$ TX for ReTX may be determined based on a size-2N polar input sequence. Moreover, under Design A, with respect to ReTX encoder input bit mapping, the selected ReTX information bit(s) and the corresponding ReTX CRC bits may be mapped to the reliable encoder input bit positions of the upper size-N polar sub-code, according to the size-N polar input sequence.

Under Design B, the number of ReTX information bits may be determined based on a size-2N polar input sequence, while the selection of one or more information bits carried in the 1$^{st}$ TX for ReTX may be determined based on a size-N polar input sequence. Moreover, under Design B, with respect to ReTX encoder input bit mapping, the selected ReTX information bit(s) and the corresponding ReTX CRC bits may be mapped to the reliable encoder input bit positions of the upper size-N polar sub-code, according to the size-N polar input sequence.

Under Design C, the number of ReTX information bits may be determined based on a lookup table or as a function of K, N and/or E, while the selection of one or more information bits carried in the 1$^{st}$ TX for ReTX may be determined based on a size-N polar input sequence. Moreover, under Design C, with respect to ReTX encoder input bit mapping, the selected ReTX information bit(s) and the corresponding ReTX CRC bits may be mapped to the reliable encoder input bit positions of the upper size-N polar sub-code, according to the size-N polar input sequence.

FIG. 7-FIG. 12 illustrate example designs 700, 800, 900, 1000, 1100 and 1200, with each showing a respective portion of a lookup table that may be used in determining the number of ReTX information bits to be selected for ReTX under Design C of the proposed scheme in accordance with the present disclosure. In the example designs 700, 800, 900, 1000, 1100 and 1200, N=4096 while the value K1 may vary depending on the value of K. It is noteworthy that, although N=4096 in the examples shown, the concept may be applied in implementations where N≠4096 in which K and K1 may correspondingly have identical or different values as those shown in FIG. 7-FIG. 12.

Illustrative Implementations

Figure 13:
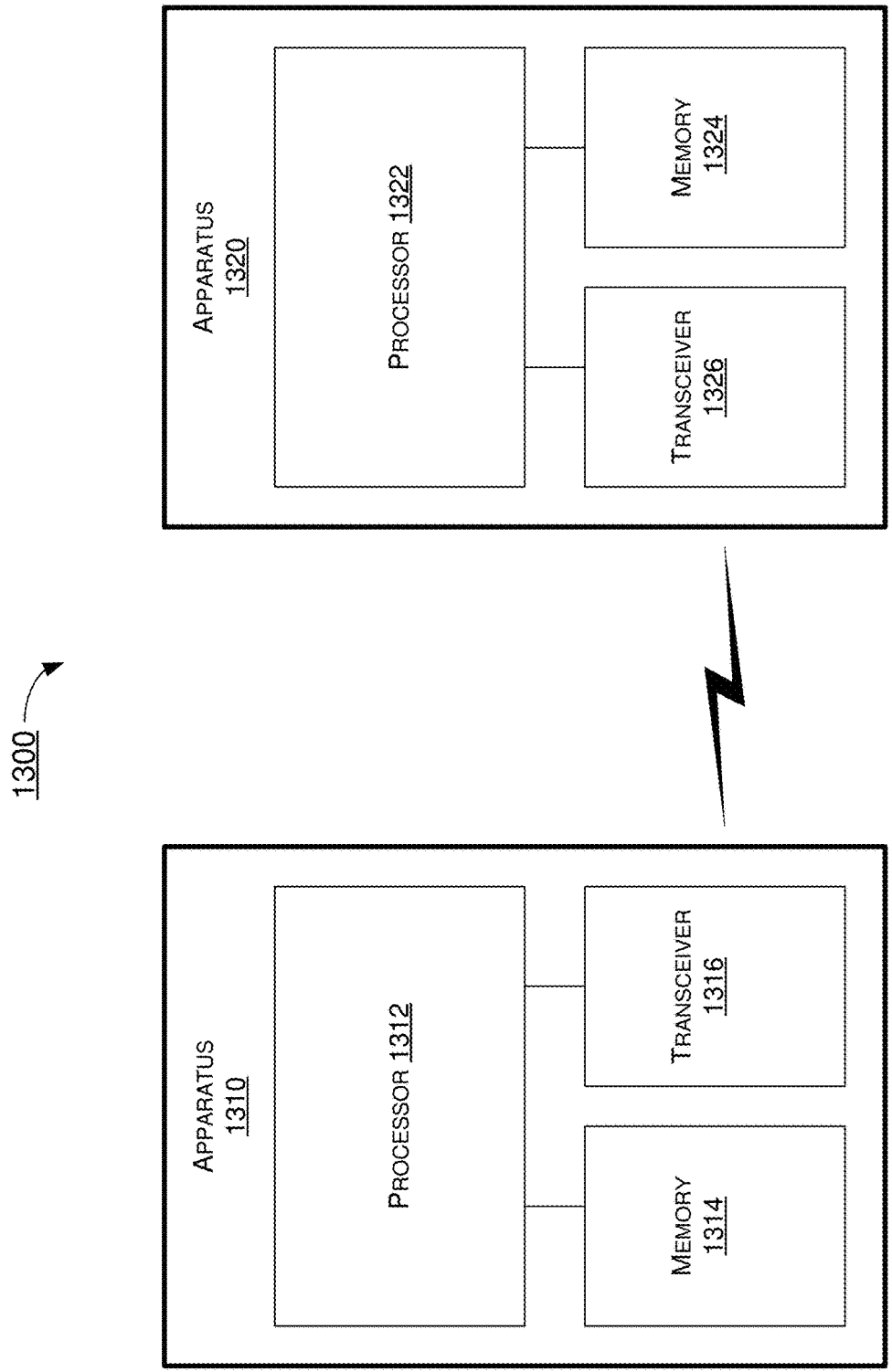
FIG. 13 is a block diagram of an example communication system in accordance with an implementation of the present disclosure.

FIG. 13 illustrates an example communication system 1300 having at least an example apparatus 1310 and an example apparatus 1320 in accordance with an implementation of the present disclosure. Each of apparatus 1310 and apparatus 1320 may perform various functions to implement schemes, techniques, processes and methods described herein pertaining to bit selection for polar coding IR-HARQ in mobile communications, including the various schemes described above with respect to various proposed designs, concepts, schemes, systems and methods described above, including network environment 100, as well as processes described below.

Each of apparatus 1310 and apparatus 1320 may be a part of an electronic apparatus, which may be a network apparatus or a UE (e.g., UE 110), such as a portable or mobile apparatus, a wearable apparatus, a vehicular device or a vehicle, a wireless communication apparatus or a computing apparatus. For instance, each of apparatus 1310 and apparatus 1320 may be implemented in a smartphone, a smart watch, a personal digital assistant, an electronic control unit (ECU) in a vehicle, a digital camera, or a computing equipment such as a tablet computer, a laptop computer or a notebook computer. Each of apparatus 1310 and apparatus 1320 may also be a part of a machine type apparatus, which may be an IoT apparatus such as an immobile or a stationary apparatus, a home apparatus, a roadside unit (RSU), a wire communication apparatus or a computing apparatus. For instance, each of apparatus 1310 and apparatus 1320 may be implemented in a smart thermostat, a smart fridge, a smart door lock, a wireless speaker or a home control center. When implemented in or as a network apparatus, apparatus 1310 and/or apparatus 1320 may be implemented in an eNodeB in an LTE, LTE-Advanced or LTE-Advanced Pro network or in a gNB or TRP in a 5G network, an NR network or an IoT network.

In some implementations, each of apparatus 1310 and apparatus 1320 may be implemented in the form of one or more integrated-circuit (IC) chips such as, for example and without limitation, one or more single-core processors, one or more multi-core processors, one or more complex-instruction-set-computing (CISC) processors, or one or more reduced-instruction-set-computing (RISC) processors. In the various schemes described above, each of apparatus 1310 and apparatus 1320 may be implemented in or as a network apparatus or a UE. Each of apparatus 1310 and apparatus 1320 may include at least some of those components shown in FIG. 13 such as a processor 1312 and a processor 1322, respectively, for example. Each of apparatus 1310 and apparatus 1320 may further include one or more other components not pertinent to the proposed scheme of the present disclosure (e.g., internal power supply, display device and/or user interface device), and, thus, such component(s) of apparatus 1310 and apparatus 1320 are neither shown in FIG. 13 nor described below in the interest of simplicity and brevity.

In one aspect, each of processor 1312 and processor 1322 may be implemented in the form of one or more single-core processors, one or more multi-core processors, or one or more CISC or RISC processors. That is, even though a singular term "a processor" is used herein to refer to processor 1312 and processor 1322, each of processor 1312 and processor 1322 may include multiple processors in some implementations and a single processor in other implementations in accordance with the present disclosure. In another aspect, each of processor 1312 and processor 1322 may be implemented in the form of hardware (and, optionally, firmware) with electronic components including, for example and without limitation, one or more transistors, one or more diodes, one or more capacitors, one or more resistors, one or more inductors, one or more memristors and/or one or more varactors that are configured and arranged to achieve specific purposes in accordance with the present disclosure. In other words, in at least some implementations, each of processor 1312 and processor 1322 is a special-purpose machine specifically designed, arranged and configured to perform specific tasks including those pertaining to bit selection for polar coding IR-HARQ in mobile communications in accordance with various implementations of the present disclosure.

In some implementations, apparatus 1310 may also include a transceiver 1316 coupled to processor 1312. Transceiver 1316 may be capable of wirelessly transmitting and receiving data. In some implementations, transceiver 1316 may be capable of wirelessly communicating with different types of wireless networks of different radio access technologies (RATs). In some implementations, transceiver 1316 may be equipped with a plurality of antenna ports (not shown) such as, for example, four antenna ports. That is, transceiver 1316 may be equipped with multiple transmit antennas and multiple receive antennas for multiple-input multiple-output (MIMO) wireless communications. In some implementations, apparatus 1320 may also include a transceiver 1326 coupled to processor 1322. Transceiver 1326 may include a transceiver capable of wirelessly transmitting and receiving data. In some implementations, transceiver 1326 may be capable of wirelessly communicating with different types of UEs/wireless networks of different RATs. In some implementations, transceiver 1326 may be equipped with a plurality of antenna ports (not shown) such as, for example, four antenna ports. That is, transceiver 1326 may be equipped with multiple transmit antennas and multiple receive antennas for MIMO wireless communications.

In some implementations, apparatus 1310 may further include a memory 1314 coupled to processor 1312 and capable of being accessed by processor 1312 and storing data therein. In some implementations, apparatus 1320 may further include a memory 1324 coupled to processor 1322 and capable of being accessed by processor 1322 and storing data therein. Each of memory 1314 and memory 1324 may include a type of random-access memory (RAM) such as dynamic RAM (DRAM), static RAM (SRAM), thyristor RAM (T-RAM) and/or zero-capacitor RAM (Z-RAM). Alternatively, or additionally, each of memory 1314 and memory 1324 may include a type of read-only memory (ROM) such as mask ROM, programmable ROM (PROM), erasable programmable ROM (EPROM) and/or electrically erasable programmable ROM (EEPROM). Alternatively, or additionally, each of memory 1314 and memory 1324 may include a type of non-volatile random-access memory (NVRAM) such as flash memory, solid-state memory, ferroelectric RAM (FeRAM), magnetoresistive RAM (MRAM) and/or phase-change memory. Alternatively, or additionally, each of memory 1314 and memory 1324 may include a UICC.

Each of apparatus 1310 and apparatus 1320 may be a communication entity capable of communicating with each other using various proposed schemes in accordance with the present disclosure. For illustrative purposes and without limitation, a description of capabilities of apparatus 1310, as a UE (e.g., UE 110), and apparatus 1320, as a network node (e.g., network node 35) of a wireless network (e.g., wireless network 30), is provided below.

Under a proposed scheme in accordance with the present disclosure with respect to bit selection for polar coding IR-HARQ in mobile communications, processor 1312 of apparatus 1310, implemented in or as UE 110, may generate a re-transmission polar CB in a polar IR-HARQ procedure. For instance, in generating the re-transmission polar CB, processor 1312 may select one or more re-transmission information bits from the plurality of information bits. Moreover, processor 1312 may transmit, via transceiver 1316, to apparatus 1320 (e.g., as network node 125) the re-transmission polar CB as a re-transmission of an initial transmission of an initial polar code carrying a plurality of information bits.

In some implementations, in selecting the one or more re-transmission information bits from the plurality of information bits, processor 1312 may perform certain operations. For instance, processor 1312 may determine a number of bits to be selected. Additionally, processor 1312 may select the determined number of bits from the plurality of information bits as the one or more re-transmission information bits. Moreover, processor 1312 may perform re-transmission encoder input bit mapping based on the one or more re-transmission information bits and a polar input sequence.

In some implementations, in determining the number of bits to be selected, processor 1312 may perform certain operations. For instance, processor 1312 may determine a first set of K most reliable input bit indices based on a size-N polar input sequence. Moreover, processor 1312 may determine a second set of the K most reliable input bit indices based on a size-2N polar input sequence. Furthermore, processor 1312 may identify a number (K1) of bit indices that is in the first set but not in the second set as the number of bits to be selected. In such cases, N may denote a size of a polar code used in generating the re-transmission polar CB, and K may denote a size of the plurality of information bits. In some implementations, in selecting the determined number of bits from the plurality of information bits, processor 1312 may select K1 information bits from the initial transmission by bit indices which is in the first set but not in the second set as the one or more re-transmission information bits. In some implementations, in performing the re-transmission encoder input bit mapping, processor 1312 may perform certain operations. For instance, processor 1312 may generate a ReTX CRC of a size C based on the one or more re-transmission information bits. Moreover, processor 1312 may map the ReTX CRC and the one or more re-transmission information bits to (K1+C) most reliable input bit indices based on the size-N polar input sequence.

Alternatively, in determining the number of bits to be selected, processor 1312 may perform certain operations. For instance, processor 1312 may determine a set of K most reliable input bit indices based on a size-2N polar input sequence. Additionally, processor 1312 may identify a number (K1) of bit indices that is in the set such that K1<N. In such cases, N may denote a size of a polar code used in generating the re-transmission polar CB, and K may denote a size of the plurality of information bits. In some implementations, in selecting the determined number of bits from the plurality of information bits, processor 1312 may select K1 information bits occupying least reliable input bit indices of the initial transmission based on a size-N polar input sequence as the one or more re-transmission information bits. In some implementations, in performing the re-transmission encoder input bit mapping, processor 1312 may perform certain operations. For instance, processor 1312 may generate a ReTX CRC of a size C based on the one or more re-transmission information bits. Moreover, processor 1312 may map the ReTX CRC and the one or more re-transmission information bits to (K1+C) most reliable input bit indices based on the size-N polar input sequence.

Still alternatively, in determining the number of bits to be selected, processor 1312 may obtain a number (K1) from a lookup table as the number of bits to be selected. In some implementations, in selecting the determined number of bits from the plurality of information bits, processor 1312 may select K1 information bits occupying least reliable input bit indices of the initial transmission based on a size-N polar input sequence as the one or more re-transmission information bits. In such cases, N may denote a size of a polar code used in generating the re-transmission polar CB. In some implementations, in performing the re-transmission encoder input bit mapping, processor 1312 may perform certain operations. For instance, processor 1312 may generate a ReTX CRC of a size C based on the one or more re-transmission information bits. Furthermore, processor 1312 may map the ReTX CRC and the one or more re-transmission information bits to (K1+C) most reliable input bit indices based on the size-N polar input sequence.

In some implementations, in generating the re-transmission polar CB, processor 1312 may utilize a joint polar code of a size N to generate the initial polar CB with a CB CRC having the size N for the initial transmission and to generate the re-transmission polar CB having a size 2N for the re-transmission.

Under another proposed scheme in accordance with the present disclosure with respect to bit selection for polar coding IR-HARQ in mobile communications, processor 1312 of apparatus 1310, implemented in or as UE 110, may receive, via transceiver 1316, from apparatus 1320 (e.g., as network node 125) an initial polar CB and a re-transmission polar CB as a re-transmission of the initial polar CB in polar IR-HARQ. The re-transmission polar CB may be generated by apparatus 1320 selecting one or more re-transmission information bits from a plurality of information bits carried in the initial polar CB. Furthermore, processor 1312 may decode the initial polar CB and the re-transmission polar CB using a same decoder.

In some implementations, the one or more re-transmission information bits may be selected from the plurality of information bits by: (a) determining a number of bits to be selected; (b) selecting the determined number of bits from the plurality of information bits as the one or more re-transmission information bits; and (c) performing re-transmission encoder input bit mapping based on the one or more re-transmission information bits and a polar input sequence.

Illustrative Processes

FIG. 14 illustrates an example process 1400 in accordance with an implementation of the present disclosure. Process 1400 may represent an aspect of implementing various proposed designs, concepts, schemes, systems and methods described above, whether partially or entirely, including those described above. More specifically, process 1400 may represent an aspect of the proposed concepts and schemes pertaining to bit selection for polar coding IR-HARQ in mobile communications. Process 1400 may include one or more operations, actions, or functions as illustrated by one or more of blocks 1410 and 1420. Although illustrated as discrete blocks, various blocks of process 1400 may be divided into additional blocks, combined into fewer blocks, or eliminated, depending on the desired implementation. Moreover, the blocks/sub-blocks of process 1400 may be executed in the order shown in FIG. 14 or, alternatively in a different order. Furthermore, one or more of the blocks/sub-blocks of process 1400 may be executed iteratively. Process 1400 may be implemented by or in apparatus 1310 and apparatus 1320 as well as any variations thereof. Solely for illustrative purposes and without limiting the scope, process 1400 is described below in the context of apparatus 1310 as a UE (e.g., UE 110) and apparatus 1320 as a communication entity such as a network node or base station (e.g., network node 125) of a wireless network (e.g., wireless network 120). Process 1400 may begin at block 1410.

At 1410, process 1400 may involve processor 1312 of apparatus 1310, implemented in or as UE 110, generating a re-transmission polar CB in a polar IR-HARQ procedure. For instance, process 1400 may involve processor 1312 selecting one or more re-transmission information bits from the plurality of information bits. Process 1400 may proceed from 1410 to 1420.

At 1420, process 1400 may involve processor 1312 transmitting, via transceiver 1316, to apparatus 1320 (e.g., as network node 125) the re-transmission polar CB as a re-transmission of an initial transmission of an initial polar code carrying a plurality of information bits.

In some implementations, the re-transmission of the polar CB may be performed with the ReTX CRC in an event that polar IR-HARQ is applied in the re-transmission.

In some implementations, in selecting the one or more re-transmission information bits from the plurality of information bits, process 1400 may involve processor 1312 performing certain operations. For instance, process 1400 may involve processor 1312 determining a number of bits to be selected. Additionally, process 1400 may involve processor 1312 selecting the determined number of bits from the plurality of information bits as the one or more re-transmission information bits. Moreover, process 1400 may involve processor 1312 performing re-transmission encoder input bit mapping based on the one or more re-transmission information bits and a polar input sequence.

In some implementations, in determining the number of bits to be selected, process 1400 may involve processor 1312 performing certain operations. For instance, process 1400 may involve processor 1312 determining a first set of K most reliable input bit indices based on a size-N polar input sequence. Moreover, process 1400 may involve processor 1312 determining a second set of the K most reliable input bit indices based on a size-2N polar input sequence. Furthermore, process 1400 may involve processor 1312 identifying a number (K1) of bit indices that is in the first set but not in the second set as the number of bits to be selected. In such cases, N may denote a size of a polar code used in generating the re-transmission polar CB, and K may denote a size of the plurality of information bits. In some implementations, in selecting the determined number of bits from the plurality of information bits, process 1400 may involve processor 1312 selecting K1 information bits from the initial transmission by bit indices which is in the first set but not in the second set as the one or more re-transmission information bits. In some implementations, in performing the re-transmission encoder input bit mapping, process 1400 may involve processor 1312 performing certain operations. For instance, process 1400 may involve processor 1312 generating a ReTX CRC of a size C based on the one or more re-transmission information bits. Moreover, process 1400 may involve processor 1312 mapping the ReTX CRC and the one or more re-transmission information bits to (K1+C) most reliable input bit indices based on the size-N polar input sequence.

Alternatively, in determining the number of bits to be selected, process 1400 may involve processor 1312 performing certain operations. For instance, process 1400 may involve processor 1312 determining a set of K most reliable input bit indices based on a size-2N polar input sequence. Additionally, process 1400 may involve processor 1312 identifying a number (K1) of bit indices that is in the set such that K1<N. In such cases, N may denote a size of a polar code used in generating the re-transmission polar CB, and K may denote a size of the plurality of information bits. In some implementations, in selecting the determined number of bits from the plurality of information bits, process 1400 may involve processor 1312 selecting K1 information bits occupying least reliable input bit indices of the initial transmission based on a size-N polar input sequence as the one or more re-transmission information bits. In some implementations, in performing the re-transmission encoder input bit mapping, process 1400 may involve processor 1312 performing certain operations. For instance, process 1400 may involve processor 1312 generating a ReTX CRC of a size C based on the one or more re-transmission information bits. Moreover, process 1400 may involve processor 1312 mapping the ReTX CRC and the one or more re-transmission information bits to (K1+C) most reliable input bit indices based on the size-N polar input sequence.

Still alternatively, in determining the number of bits to be selected, process 1400 may involve processor 1312 obtaining a number (K1) from a lookup table as the number of bits to be selected. In some implementations, in selecting the determined number of bits from the plurality of information bits, process 1400 may involve processor 1312 selecting K1 information bits occupying least reliable input bit indices of the initial transmission based on a size-N polar input sequence as the one or more re-transmission information bits. In such cases, N may denote a size of a polar code used in generating the re-transmission polar CB. In some implementations, in performing the re-transmission encoder input bit mapping, process 1400 may involve processor 1312 performing certain operations. For instance, process 1400 may involve processor 1312 generating a ReTX CRC of a size C based on the one or more re-transmission information bits. Furthermore, process 1400 may involve processor 1312 mapping the ReTX CRC and the one or more re-transmission information bits to (K1+C) most reliable input bit indices based on the size-N polar input sequence.

In some implementations, in generating the re-transmission polar CB, process 1400 may involve processor 1312 utilizing a joint polar code of a size N to generate the initial polar CB with a CB CRC having the size N for the initial transmission and to generate the re-transmission polar CB having a size 2N for the re-transmission.

FIG. 15 illustrates an example process 1500 in accordance with an implementation of the present disclosure. Process 1500 may represent an aspect of implementing various proposed designs, concepts, schemes, systems and methods described above, whether partially or entirely, including those described above. More specifically, process 1500 may represent an aspect of the proposed concepts and schemes pertaining to bit selection for polar coding IR-HARQ in mobile communications. Process 1500 may include one or more operations, actions, or functions as illustrated by one or more of blocks 1510 and 1520. Although illustrated as discrete blocks, various blocks of process 1500 may be divided into additional blocks, combined into fewer blocks, or eliminated, depending on the desired implementation. Moreover, the blocks/sub-blocks of process 1500 may be executed in the order shown in FIG. 15 or, alternatively in a different order. Furthermore, one or more of the blocks/sub-blocks of process 1500 may be executed iteratively. Process 1500 may be implemented by or in apparatus 1310 and apparatus 1320 as well as any variations thereof. Solely for illustrative purposes and without limiting the scope, process 1500 is described below in the context of apparatus 1310 as a UE (e.g., UE 110) and apparatus 1320 as a communication entity such as a network node or base station (e.g., network node 125) of a wireless network (e.g., wireless network 120). Process 1500 may begin at block 1510.

At 1510, process 1500 may involve processor 1312 of apparatus 1310, implemented in or as UE 110, receiving, via transceiver 1316, from apparatus 1320 (e.g., as network node 125) an initial polar CB and a re-transmission polar CB as a re-transmission of the initial polar CB in polar IR-HARQ. The re-transmission polar CB may be generated by apparatus 1320 selecting one or more re-transmission information bits from a plurality of information bits carried in the initial polar CB. Process 1500 may proceed from 1510 to 1520.

At 1520, process 1500 may involve processor 1312 decoding the initial polar CB and the re-transmission polar CB using a same decoder.

In some implementations, the one or more re-transmission information bits may be selected from the plurality of information bits by: (a) determining a number of bits to be selected; (b) selecting the determined number of bits from the plurality of information bits as the one or more re-transmission information bits; and (c) performing re-transmission encoder input bit mapping based on the one or more re-transmission information bits and a polar input sequence.

Additional Notes

The herein-described subject matter sometimes illustrates different components contained within, or connected with, different other components. It is to be understood that such depicted architectures are merely examples, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

Further, with respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

Moreover, it will be understood by those skilled in the art that, in general, terms used herein, and especially in the appended claims, e.g., bodies of the appended claims, are generally intended as "open" terms, e.g., the term "including" should be interpreted as "including but not limited to," the term "having" should be interpreted as "having at least," the term "includes" should be interpreted as "includes but is not limited to," etc. It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to implementations containing only one such recitation, even when the same claim includes the introductory phrases "one or more" or "at least one" and indefinite articles such as "a" or "an," e.g., "a" and/or "an" should be interpreted to mean "at least one" or "one or more;" the same holds true for the use of definite articles used to introduce claim recitations. In addition, even if a specific number of an introduced claim recitation is explicitly recited, those skilled in the art will recognize that such recitation should be interpreted to mean at least the recited number, e.g., the bare recitation of "two recitations," without other modifiers, means at least two recitations, or two or more recitations. Furthermore, in those instances where a convention analogous to "at least one of A, B, and C, etc." is used, in general such a construction is intended in the sense one having skill in the art would understand the convention, e.g., "a system having at least one of A, B, and C" would include but not be limited to systems that have A alone, B alone, C alone, A and B together, A and C together, B and C together, and/or A, B, and C together, etc. In those instances where a convention analogous to "at least one of A, B, or C, etc." is used, in general such a construction is intended in the sense one having skill in the art would understand the convention, e.g., "a system having at least one of A, B, or C" would include but not be limited to systems that have A alone, B alone, C alone, A and B together, A and C together, B and C together, and/or A, B, and C together, etc. It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

From the foregoing, it will be appreciated that various implementations of the present disclosure have been described herein for purposes of illustration, and that various modifications may be made without departing from the scope and spirit of the present disclosure. Accordingly, the various implementations disclosed herein are not intended to be limiting, with the true scope and spirit being indicated by the following claims.

What is claimed is:

1. A method, comprising:
    generating, by a processor of an apparatus, a re-transmission polar code block (CB) in a polar incremental redundancy hybrid automatic repeat request (IR-HARQ) procedure; and
    transmitting, by the processor, the re-transmission polar CB as a re-transmission of an initial transmission of an initial polar code carrying a plurality of information bits,
    wherein the generating of the re-transmission polar CB comprises selecting, by a re-transmission (ReTX) information bit selection circuit of the processor, one or more re-transmission information bits from the plurality of information bits,
    wherein the selecting of the one or more re-transmission information bits from the plurality of information bits comprises determining a number of bits to be selected,
    wherein, in determining the number of bits to be selected, the ReTx information bit selection circuit performs operations comprising:
        determining a first set of K most reliable input bit indices based on a size-N polar input sequence from a polar input sequence circuit of the processor;
        determining a second set of the K most reliable input bit indices based on a size-2N polar input sequence from the polar input sequence circuit; and
        identifying a number (K1) of bit indices based on the first set and the second set,
    wherein N denotes a size of a polar code used in generating the re-transmission polar CB, and
    wherein K denotes a size of the plurality of information bits.

2. The method of claim 1, wherein the selecting of the one or more re-transmission information bits from the plurality of information bits further comprises:
    selecting the determined number of bits from the plurality of information bits as the one or more re-transmission information bits; and
    performing re-transmission encoder input bit mapping based on the one or more re-transmission information bits and a polar input sequence.

3. The method of claim 1, wherein the identifying of the K1 of bit indices based on the first set and the second set comprises:
    determining a third set of input bit indices from the second set of the K most reliable input bit indices, wherein index values of the third set of input bit indices are greater or equal to N;
    performing a modulo-N operation on the index values of the third set of input bit indices; and
    identifying the number (K1) of bit indices that is in the first set but not in the third set as the number of bits to be selected.

4. The method of claim 2, wherein the selecting of the determined number of bits from the plurality of information bits comprises selecting K1 information bits from the initial transmission by bit indices which is in the first set but not in the second set as the one or more re-transmission information bits.

5. The method of claim 4, wherein the performing of the re-transmission encoder input bit mapping comprises:
    generating a re-transmission cyclic redundancy check (ReTX CRC) of a size C based on the one or more re-transmission information bits; and mapping the ReTX CRC and the one or more re-transmission information bits to (K1+C) most reliable input bit indices based on the size-N polar input sequence.

6. The method of claim 2, wherein the determining of the number of bits to be selected comprises:
determining the second set of K most reliable input bit indices based on the size-2N polar input sequence; and
identifying another value of the K1 of bit indices that is in the set such that K1<N.

7. The method of claim 6, wherein the selecting of the determined number of bits from the plurality of information bits comprises selecting K1 information bits occupying least reliable input bit indices of the initial transmission based on a size-N polar input sequence as the one or more re-transmission information bits.

8. The method of claim 7, wherein the performing of the re-transmission encoder input bit mapping comprises:
generating a re-transmission cyclic redundancy check (ReTX CRC) of a size C based on the one or more re-transmission information bits; and
mapping the ReTX CRC and the one or more re-transmission information bits to (K1+C) most reliable input bit indices based on the size-N polar input sequence.

9. The method of claim 1, wherein the determining of the number of bits to be selected comprises obtaining the K1 from a lookup table as the number of bits to be selected.

10. The method of claim 9, wherein the selecting of the determined number of bits from the plurality of information bits comprises selecting K1 information bits occupying least reliable input bit indices of the initial transmission based on a size-N polar input sequence as the one or more re-transmission information bits.

11. The method of claim 10, wherein the performing of the re-transmission encoder input bit mapping comprises:
generating a re-transmission cyclic redundancy check (ReTX CRC) of a size C based on the one or more re-transmission information bits; and
mapping the ReTX CRC and the one or more re-transmission information bits to (K1+C) most reliable input bit indices based on the size-N polar input sequence.

12. The method of claim 1, wherein the generating of the re-transmission polar CB comprises utilizing a joint polar code of a size N to generate the initial polar CB with a code block cyclic redundancy check (CB CRC) having the size N for the initial transmission and to generate the re-transmission polar CB having a size 2N for the re-transmission.

13. An apparatus, comprising:
a transceiver configured to communicate wirelessly; and
a processor coupled to the transceiver and configured to perform operations comprising:
generating a re-transmission polar code block (CB) in a polar incremental redundancy hybrid automatic repeat request (IR-HARQ) procedure; and
transmitting, via the transceiver, the re-transmission polar CB as a re-transmission of an initial transmission of an initial polar code carrying a plurality of information bits,
wherein the generating of the re-transmission polar CB comprises selecting, by a re-transmission (ReTX) information bit selection circuit of the processor, one or more re-transmission information bits from the plurality of information bits,
wherein, in selecting the one or more re-transmission information bits from the plurality of information bits, the ReTx information bit selection circuit is configured to determine a number of bits to be selected, wherein, in determining the number of bits to be selected, the ReTx information bit selection circuit is configured to perform operations comprising:
determining a first set of K most reliable input bit indices based on a size-N polar input sequence from a polar input sequence circuit of the processor;
determining a second set of the K most reliable input bit indices based on a size-2N polar input sequence from the polar input sequence circuit; and
identifying a number (K1) of bit indices based on the first set and the second set,
wherein N denotes a size of a polar code used in generating the re-transmission polar CB, and
wherein K denotes a size of the plurality of information bits.

14. The apparatus of claim 13, wherein, in selecting the one or more re-transmission information bits from the plurality of information bits, the processor is configured to further perform operations comprising:
selecting the determined number of bits from the plurality of information bits as the one or more re-transmission information bits; and
performing re-transmission encoder input bit mapping based on the one or more re-transmission information bits and a polar input sequence.

15. The apparatus of claim 14, wherein:
in selecting the determined number of bits from the plurality of information bits, the processor is configured to select K1 information bits from the initial transmission by bit indices which is in the first set but not in the second set as the one or more re-transmission information bits, and
in performing the re-transmission encoder input bit mapping, the processor is configured to perform operations comprising:
generating a re-transmission cyclic redundancy check (ReTX CRC) of a size C based on the one or more re-transmission information bits; and
mapping the ReTX CRC and the one or more re-transmission information bits to (K1+C) most reliable input bit indices based on the size-N polar input sequence.

16. The apparatus of claim 14, wherein:
in determining the number of bits to be selected, the processor is configured to perform operations comprising:
determining the second set of K most reliable input bit indices based on the size-2N polar input sequence; and
identifying another value of the K1 of bit indices that is in the set such that K1<N,
in selecting the determined number of bits from the plurality of information bits, the processor is configured to select K1 information bits occupying least reliable input bit indices of the initial transmission based on a size-N polar input sequence as the one or more re-transmission information bits, and
in performing the re-transmission encoder input bit mapping, the processor is configured to perform operations comprising:
generating a re-transmission cyclic redundancy check (ReTX CRC) of a size C based on the one or more re-transmission information bits; and
mapping the ReTX CRC and the one or more re-transmission information bits to (K1+C) most reliable input bit indices based on the size-N polar input sequence.

17. The apparatus of claim 14, wherein:
in determining the number of bits to be selected, the processor is configured to obtain the K1 from a lookup table as the number of bits to be selected,
in selecting the determined number of bits from the plurality of information bits, the processor is configured to select K1 information bits occupying least reliable input bit indices of the initial transmission based on a size-N polar input sequence as the one or more re-transmission information bits,
in performing the re-transmission encoder input bit mapping, the processor is configured to perform operations comprising:
    generating a re-transmission cyclic redundancy check (ReTX CRC) of a size C based on the one or more re-transmission information bits; and
    mapping the ReTX CRC and the one or more re-transmission information bits to (K1+C) most reliable input bit indices based on the size-N polar input sequence.

18. The apparatus of claim 13, wherein, in generating the re-transmission polar CB, the processor is configured to utilize a joint polar code of a size N to generate the initial polar CB with a code block cyclic redundancy check (CB CRC) having the size N for the initial transmission and to generate the re-transmission polar CB having a size 2N for the re-transmission.

19. The apparatus of claim 13, wherein, in identifying the K1 of bit indices based on the first set and the second set, the processor is configured to perform operations comprising:
    determining a third set of input bit indices from the second set of the K most reliable input bit indices, wherein index values of the third set of input bit indices are greater or equal to N;
    performing a modulo-N operation on the index values of the third set of input bit indices; and
    identifying the number (K1) of bit indices that is in the first set but not in the third set as the number of bits to be selected.

* * * * *